(12) United States Patent
Kim (10) Patent No.: US 9,745,657 B2
(45) Date of Patent: Aug. 29, 2017

(54) DEPOSITION APPARATUS, METHOD OF FORMING THIN FILM BY USING THE SAME, AND METHOD OF MANUFACTURING ORGANIC LIGHT-EMITTING DISPLAY APPARATUS

(71) Applicant: SAMSUNG DISPLAY CO., LTD., Yongin, Gyeonggi-Do (KR)

(72) Inventor: Hakmin Kim, Yongin (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 0 days.

(21) Appl. No.: 14/636,309

(22) Filed: Mar. 3, 2015

(65) Prior Publication Data

US 2016/0064697 A1 Mar. 3, 2016

(30) Foreign Application Priority Data

Aug. 26, 2014 (KR) .................. 10-2014-0111621

(51) Int. Cl.
| | |
|---|---|
| C23C 16/44 | (2006.01) |
| C23C 16/04 | (2006.01) |
| C23C 16/34 | (2006.01) |
| H01L 51/00 | (2006.01) |
| H01L 51/52 | (2006.01) |

(52) U.S. Cl.
CPC ........ *C23C 16/4405* (2013.01); *C23C 16/042* (2013.01); *C23C 16/345* (2013.01); *H01L 51/0011* (2013.01); *H01L 51/5256* (2013.01)

(58) Field of Classification Search
CPC . C23C 16/042; C23C 16/345; H01L 51/0011; H01L 21/0337
USPC .......................................... 427/282
See application file for complete search history.

(56) References Cited

U.S. PATENT DOCUMENTS

2007/0072337 A1* 3/2007 Matsuzaki ............ C23C 14/042
438/99
2013/0071775 A1 3/2013 Prushinskiy et al.

FOREIGN PATENT DOCUMENTS

| JP | 2014-065929 A | 4/2014 |
|---|---|---|
| KR | 10-2002-0082962 A | 11/2002 |
| KR | 10-2006-0023497 A | 3/2006 |

* cited by examiner

*Primary Examiner* — Alex A Rolland
(74) *Attorney, Agent, or Firm* — Lee & Morse P.C.

(57) ABSTRACT

A deposition apparatus includes a chamber, a support in the chamber, the support supporting a substrate, a deposition source in the chamber, the deposition source being above the support and emitting one or more deposition materials toward the substrate, a mask between the support and the deposition source, the mask including a deposition region having one or more openings, the one or more deposition materials passing through the one or more openings, and an edge region having a plurality of first slits, the edge region surrounding the deposition region, and a first coating layer on a first surface of the mask, the first surface of the mask facing the substrate.

15 Claims, 6 Drawing Sheets

DEPOSITION APPARATUS, METHOD OF FORMING THIN FILM BY USING THE SAME, AND METHOD OF MANUFACTURING ORGANIC LIGHT-EMITTING DISPLAY APPARATUS

CROSS-REFERENCE TO RELATED APPLICATION

Korean Patent Application No. 10-2014-0111621, filed on Aug. 26, 2014, in the Korean Intellectual Property Office, and entitled: "Deposition Apparatus, Method of Forming Thin Film by Using the Same, and Method of Manufacturing Organic Light-Emitting Display Apparatus," is incorporated by reference herein in its entirety.

BACKGROUND

1. Field

One or more embodiments relate to a deposition apparatus, a method of forming a thin film by using the same, and a method of manufacturing an organic light-emitting display apparatus.

2. Description of the Related Art

Semiconductor devices, display devices, and other electronic devices include multiple thin films. There are various methods of forming the thin films, one of which is a deposition method.

Various raw materials for forming the thin films may be used in the deposition method. For example, one or more gases are used. The deposition method may be chemical vapor deposition (CVD), atomic layer deposition (ALD), or the like.

Among display apparatuses, an organic light-emitting display apparatus has a wide viewing angle, a good contrast, and a fast response speed. Thus, the organic light-emitting display apparatus has drawn attention as a next-generation display apparatus.

The organic light-emitting display apparatus includes a first electrode, a second electrode facing the first electrode, an intermediate layer, which includes an emission layer and is disposed between the first and second electrodes, and one or more various thin films. A deposition process may be performed to form the thin films of the organic light-emitting display apparatus.

SUMMARY

According to one or more embodiments, a deposition apparatus includes a chamber, a support in the chamber, the support supporting a substrate, a deposition source in the chamber, the deposition source being above the support and emitting one or more deposition materials toward the substrate, a mask between the support and the deposition source, the mask including a deposition region having one or more openings, the one or more deposition materials passing through the one or more openings, and an edge region having a plurality of first slits, the edge region surrounding the deposition region, and a first coating layer on a first surface of the mask, the first surface of the mask facing the substrate.

The first coating layer may include a plurality of second slits which overlap at least some of the plurality of the first slits.

The deposition apparatus may further include a second coating layer which is formed on the mask on an opposite surface to the surface of the edge region.

The first coating layer may include a plurality of second slits which overlap at least some of the plurality of the first slits, and the second coating layer may include a plurality of third slits which overlap at least some of the plurality of the first slits.

The first coating layer and the second coating layer may include at least one of silicon oxynitride (SiON), and silicon nitride (SiNx).

The mask may be formed of a metal.

The plurality of the first slits may be formed by at least one of laser beam machining, wet etching, and dry etching.

According to one or more embodiments of the present invention, a method of forming a thin film, the method includes: inserting a mask into a chamber; depositing a first coating layer on a surface of an edge region of the mask, the surface being in contact with to a substrate, by emitting one or more deposition materials from the deposition source toward the mask through a plurality of first slits formed in the edge region of the mask; arranging the substrate on a support and arranging the mask on the substrate so that the first coating layer contacts the substrate; and forming a thin film on the substrate by emitting the one or more deposition materials from the deposition source towards the substrate, the one or more deposition materials passing through a plurality of openings formed in the mask.

The first coating layer may include a plurality of second slits which overlap at least some of the plurality of first slits.

The method of claim may further include depositing a second coating layer on the mask on an opposite surface to the surface of the edge region which is in contact with the substrate.

The first coating layer may include a plurality of second slits which overlap at least some of the plurality of first slits, and the second coating layer may include a plurality of third slits which overlap at least some of the plurality of first slits.

In the depositing of the first coating layer and the depositing of the second coating layer, the substrate may be disposed outside the chamber.

The method may further include cleansing the chamber by inserting remote plasma into the chamber, wherein the remote plasma may be generated by a cleansing unit connected to the chamber and the cleansing of the chamber may be performed before the inserting of the mask into the chamber.

The method may further include cleansing the chamber by inserting remote plasma into the chamber, wherein the remote plasma may be generated by a cleansing unit connected to the chamber and the cleansing of the chamber may be performed after the forming of the film.

The mask may be formed of a metal.

The plurality of first slits may be formed by at least one of laser beam machining, wet etching, and dry etching.

The first coating layer and the second coating layer may include at least one of silicon oxynitride (SiON), and silicon nitride (SiNx).

According to one or more embodiments, a method of manufacturing an organic light-emitting display apparatus, the method includes: inserting a substrate for forming the organic light-emitting display apparatus into a chamber; arranging the substrate on a support; arranging a mask on the substrate, wherein the mask includes: a deposition region including one or more openings, an edge region which surrounds the deposition region and includes a plurality of first slits; a first coating layer which is formed on a surface of the edge region which is in contact with the substrate and contacts the substrate; and a second coating layer which is formed on the mask on an opposite surface to the surface of the edge region parallel to the substrate, manufacturing the organic light-emitting display apparatus by emitting one or more deposition materials for forming a thin film from a deposition source toward the substrate.

The method may further include forming a first electrode, an intermediate layer including an emission layer, a second electrode, and an encapsulation layer on the substrate, wherein the forming of the thin film may include forming the encapsulation layer.

The forming of the thin film may include forming a conductive layer.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

While such terms as "first", "second", etc., may be used to describe various components, such components must not be limited to the above terms. The above terms are used only to distinguish one component from another. An expression used in the singular encompasses the expression of the plural, unless it has a clearly different meaning in the context. In the present specification, it is to be understood that the terms such as "including", "having", and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

When a certain embodiment may be implemented differently, a specific process order may be performed differently from the described order. For example, two consecutively described processes may be performed substantially at the same time or performed in an order opposite to the described order.

Figure 1:
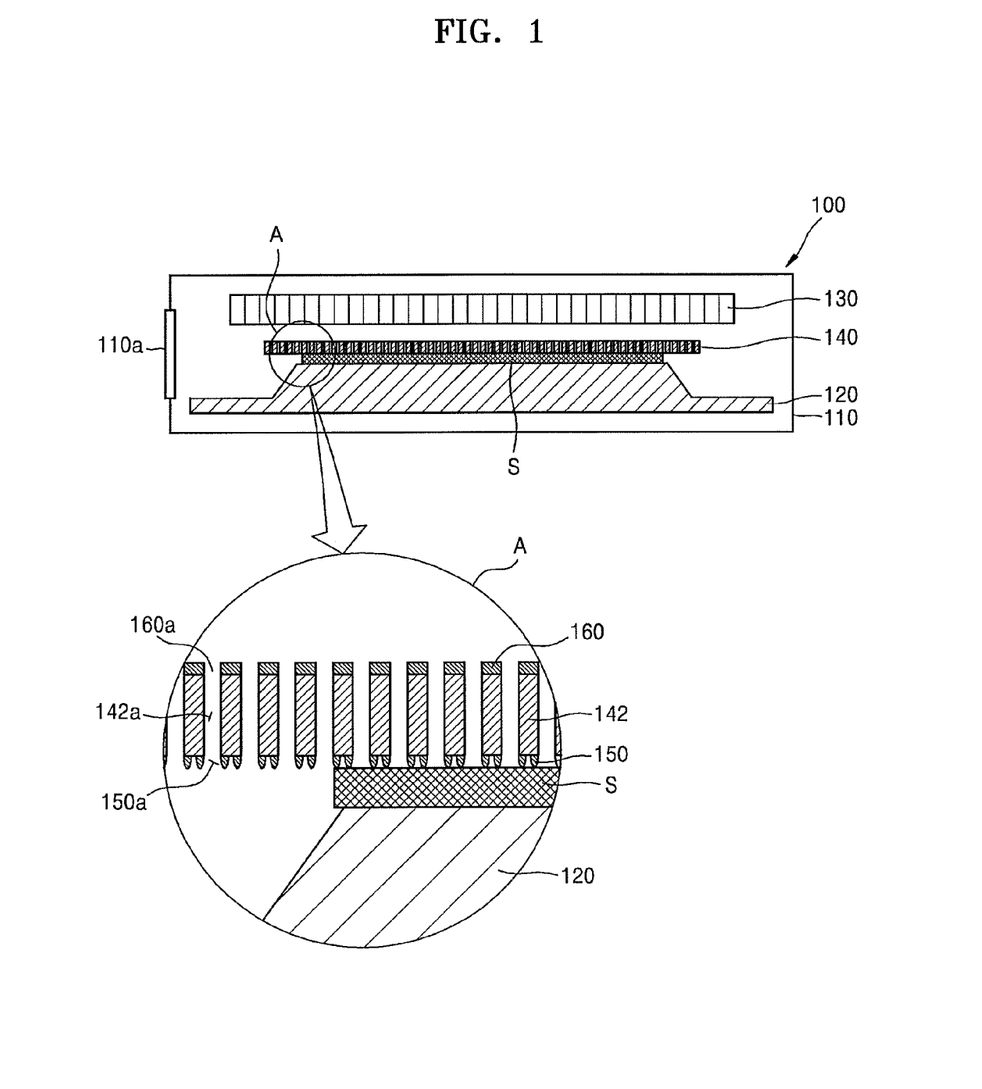
FIG. 1 illustrates a conceptual view of a schematic structure of a deposition apparatus and an enlarged portion of the deposition apparatus according to an embodiment.
Figure 2:
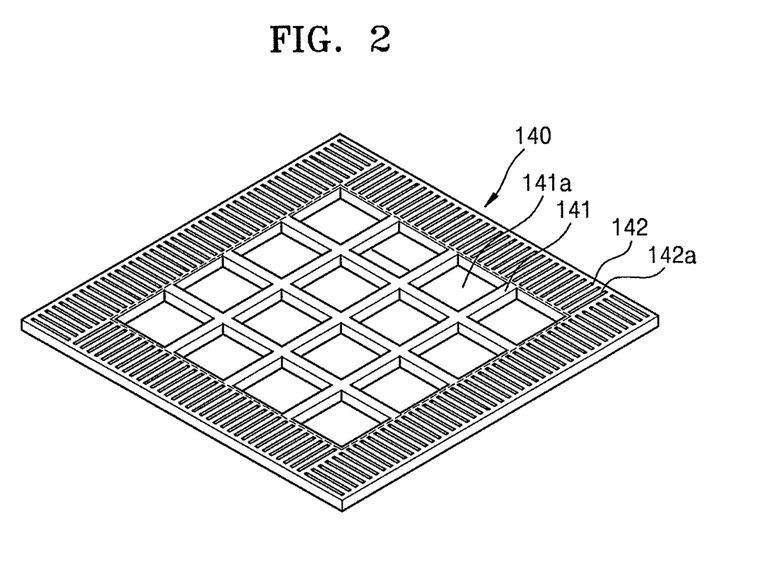
FIG. 2 illustrates an enlarged perspective view of a mask of FIG. 1.

FIG. 1 is a conceptual view of a schematic structure of a deposition apparatus 100 according to an embodiment. FIG. 2 is a perspective view of a mask 140 of FIG. 1.

Referring to FIG. 1, the deposition apparatus 100 may include a chamber 110, a support 120, a deposition source 130, and the mask 140. The mask 140 is positioned between the deposition source 130 and the support 120, such that a substrate S is between the support 120 and the mask 140. An enlarged portion A of FIG. 1 illustrates a first coating layer 150 on the mask 140, as will be described in more detail below.

The chamber 110 may be connected to a pump (not shown) in order to control an atmospheric pressure during a deposition process, and may house and protect the substrate S, the support 120, and the deposition source 130. In addition, the chamber 110 may include one or more openings 110a via which the substrate S and/or the mask 140 are inserted into the chamber 110.

The substrate S, on which the deposition process is to be performed, is disposed on the support 120. While the deposition process is performed on the substrate S, the support 120 fixes the substrate S in order to prevent the substrate S from moving or shaking. To this end, the support 120 may include a clamp (not shown) for preventing movement or shaking of the substrate S. Also, the support 120 may include one or more adsorption holes (not shown) for adsorbing the substrate S.

The deposition source 130 is disposed to face the support 120 and emits deposition materials toward the substrate S to perform the deposition process on the substrate S. That is, the deposition source 130 is disposed above an upper surface of the support 120. As a specific example of the deposition source 130, the deposition source 130 may be a shower head which emits one or more deposition materials toward the substrate S.

Also, a voltage may be applied between the deposition source 130 and the support 120 so that the deposition materials, which are emitted from the deposition source 130 toward the substrate S and are in a gaseous state, are changed to a plasma state. That is, the deposition apparatus 100 may be a plasma enhanced chemical vapor deposition (PECVD) apparatus.

As a detailed example of a voltage application, voltages may be applied to the support 120 and the deposition source 130, respectively. However, embodiments are not limited thereto, and a separate electrode (not shown) may be arranged on the deposition apparatus 100 in order to generate plasma between the support 120 and the deposition source 130.

A size of the deposition source 130 is not limited. For example, the deposition source 130 may be formed to have a greater area than the substrate S or a greater area than the mask 140. The deposition source 130 may form a thin film on an entire surface of the substrate S.

Referring to FIGS. 1 and 2, the mask 140 is disposed between the support 120 and the deposition source 130. The mask 140 includes a deposition region 141 having openings 141a, through which the deposition materials emitted from the deposition source 130 pass during the deposition process, and an edge region 142. The edge region 142 surrounds the deposition region 141 and includes first slits 142a. The first slits 142a may be formed by at least one of, e.g., laser beam machining, wet etching, and dry etching.

The deposition materials emitted from the deposition source 130 pass through the openings 141a formed in the deposition region 141, e.g., during the deposition process, and form a thin film on the substrate S. The number of openings 141a formed in the mask 140 may vary according to a size of the mask 140. In general, the openings 141a may have a greater size than the first slits 142a, e.g., each of the openings 141a may correspond to a display panel to be formed on the substrate S.

The first slits 142a shown in FIG. 2 have a stripe shape, but embodiments are not limited thereto, e.g., the first slits 142a may have a dot shape. The deposition materials emitted from the deposition source 130 pass through the first slits 142a of the edge region 14, e.g., during the pre-deposition process, to form the first coating layer 150.

The first coating layer 150 is formed on, e.g., directly on, the mask 140 via the deposition materials that are emitted from the deposition source 130 during the pre-deposition process and pass through the first slits 142a. The first coating layer 150 may be, e.g., on the edge region 142 facing the substrate S, and may contact the substrate S. For example, as illustrated in the enlarged portion A of FIG. 1, the first coating layer 150 may be a discontinuous layer on a surface of the mask 140 facing the substrate S, such that second slits 150a in the first coating layer 150 may align with corresponding first slits 142a in the mask 140. The first coating layer 150 may be between, e.g., directly contact both, the substrate S and the mask 140, while the second slits 150a aligned with the first slits 142a. Hereinafter, a surface of the mask 140 facing the substrate S is referred to as a lower surface, and an opposite surface to the lower surface of the mask 140 is referred to as an upper surface.

As described previously, the first coating layer 150 is formed on the lower surface of the mask 140, e.g., on the edge region 142, and the lower surface contacts the substrate S. The first coating layer 150 may include the second slits 150a which overlap at least some of the first slits 142a. Accordingly, the first coating layer 150 separates between the substrate S and the mask 140 during deposition.

FIG. 1 shows that a portion of the first coating layer 150, which is adjacent to the first slits 142a, is greater than other portions of the first coating layer 150. In other words, as illustrated in the enlarged portion A of FIG. 1, the first coating layer 150 is not a flat film on the lower surface of the mask 140, but portions of the first coating layer 150 directly adjacent the second slits 150a are thicker than portions of the first coating layer 150 in a center of the lower surface of the mask 140 between two adjacent second slits 150a. This is because the deposition materials emitted from the deposition source 130 pass through the first slits 142a in a downward direction during the pre-deposition process, and thus, the deposition materials passing through the first slits 142a in the downward direction are deposited on a region adjacent to the first slits 142a. A thickness of the first coating layer 150 may be changed by adjusting an exposure time of the deposition source 130 to the mask 140 during the pre-deposition process.

If the mask 140 were to be adhered to the substrate S without any structure therebetween, i.e., without the first coating layer 150 therebetween, the mask 140 would directly contact a metal, e.g., a cathode electrode (not shown), on the substrate S during a vacuum deposition, e.g., a chemical vapor deposition (CVD), a plasma enhanced chemical vapor deposition (PECVD), or an atomic layer deposition (ALD). However, since a typical mask is formed of metal, e.g., stainless steel (SUS) or aluminum (Al), when the mask contacts metal, e.g., a cathode electrode, on the substrate S, defects due to static charges, e.g., electrical arcs or electrical burns, may occur.

Further, if the mask 140 were to be arranged on the substrate S to be spaced apart at a regular interval from the substrate S, i.e., in order to avoid direct contact with the substrate S, the deposition materials could be deposited on an unwanted region, e.g., a dead zone of the substrate S. Therefore, a display defect, e.g., a shadow effect, could occur. It is necessary to decrease the occurrence frequency of the shadow effect or prevent the occurrence thereof in order to manufacture a high-definition organic light-emitting display apparatus. Therefore, an adhesion degree of the substrate S and the mask 140 needs to be improved.

The first coating layer 150 may include at least one insulating material, e.g., SiON and/or $SiN_x$. Therefore, if the first coating layer 150 is formed on a surface of the mask 140 in contact with the substrate S, occurrence of defects due to static charges may be prevented. Also, damage of the mask 140 caused by such defects may be controlled, and thus, a replacement cycle of the mask 140 during the deposition process may be extended.

Referring back to FIG. 1, a second coating layer 160 may be formed on the upper surface of the mask 140, e.g., on the edge region 142. The second coating layer 160 is formed during the pre-deposition process when the deposition materials are emitted from the deposition source 130 in order to form the first coating layer 150.

The second coating layer 160 may include third slits 160a which overlap at least some of the first slits 142a. As shown in FIG. 1, unlike the first coating layer 150, the second coating layer 160 is formed to have a flat form on the upper surface of the mask 140 because the deposition materials emitted from the deposition source 130 do not pass through the first slits 142a when the second coating layer 160 is formed.

Figure 3:
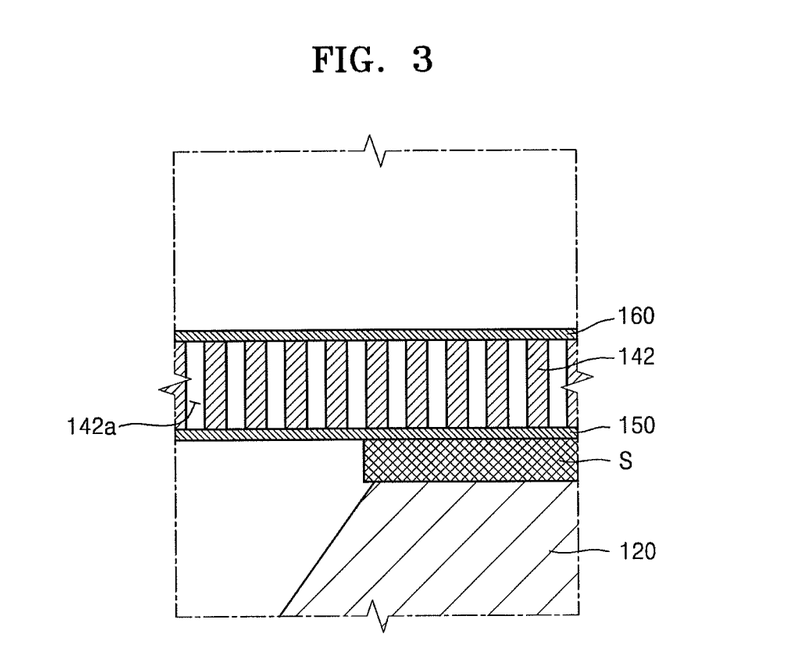
FIG. 3 illustrates a modified example of a first coating layer and a second coating layer of FIG. 1.

FIG. 3 is an enlarged portion A of FIG. 1 according to a modified embodiment. Referring to FIG. 3, the first coating layer 150 and the second coating layer 160 may be respectively deposited on the lower and upper surfaces of the mask 140 as thin films. This may happen when an exposure time of the mask 140 to the deposition source 130 to form the first and second coating layers 150 and 160 of FIG. 1 is greater than an exposure time of the first and second coating layers 150 and 160 to the deposition source 130.

Hereinafter, a method of depositing the first and second coating layers and on a mask and a method of forming a thin film on the substrate S by using a deposition apparatus 200 including a mask 240 on which the first and second coating layers and are deposited will be described with reference to FIGS. 4 to 6.

Figure 4:
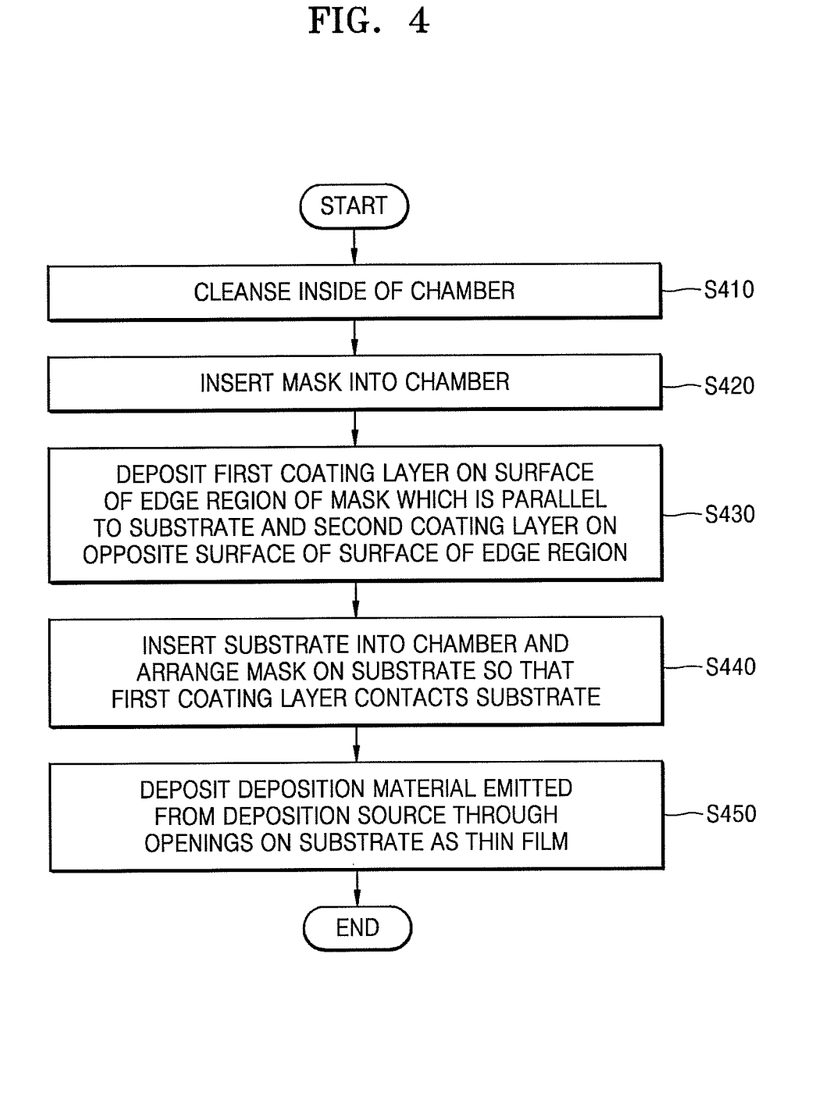
FIG. 4 illustrates a flowchart of a method of forming a thin film by using a deposition apparatus according to another embodiment.

FIG. 4 is a flowchart of a method of forming a thin film by using the deposition apparatus 200. FIGS. 5A-5C are cross-sectional views of stages in the method of FIG. 4, and FIG. 6 is a schematic conceptual view of the deposition apparatus 200.

Figure 6:
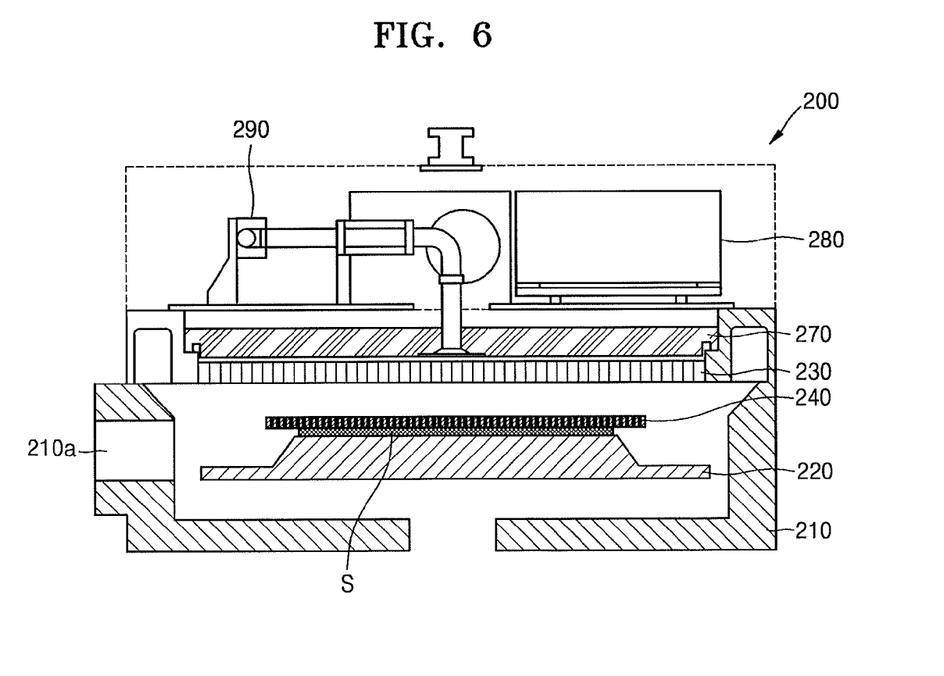
FIG. 6 illustrates a schematic conceptual view of a deposition apparatus according to another embodiment.

Referring to FIG. 6, the deposition apparatus 200 may include a chamber 210, a support 220, a deposition source 230, a mask 240, a base plate 270, a power unit 280, and a cleansing unit 290.

The chamber 210 may be connected to a pump (not shown) in order to control an atmospheric pressure during a deposition process, and houses and protects the substrate S, the support 220, and the deposition source 230. Also, the chamber 210 may include one or more openings 210a configured to allow the substrate S or the mask 240 to pass therethrough.

The substrate S, on which the deposition process is to be performed, is arranged on the support 220. When the deposition process is performed on the substrate S, the support 220 fixes the substrate S in order to prevent the substrate S from moving or shaking. Thus, the support 220 may further include a clamp (not shown) for preventing movement or shaking of the substrate S. Also, the support 220 may further include one or more adsorption holes (not shown) for adsorbing the support 120.

The deposition source 230 is disposed to face the support 220 and emits one or more materials, i.e., deposition materials, toward the substrate S in order to perform the deposition process on the substrate S. That is, the deposition source 230 is disposed above an upper surface of the support 220. As a specific example, the deposition source 230 may be a shower head which emits one or more deposition materials toward the substrate S. Also, the deposition source 230 may be a diffuser which evenly emits the deposition materials on an entire surface of the substrate S.

A size of the deposition source 230 is not limited. That is, the deposition source 230 may formed to have a greater size than the substrate S, and by doing so, an even deposition layer may be formed on the entire surface of the substrate S.

The mask 240 is arranged between the support 220 and the deposition source 230, and like the mask 140 shown in FIGS. 1 and 3, a first coating layer 250 is deposited on the lower surface of the mask 240, and a second coating layer 260 is deposited on the upper surface of the mask 240. A method of depositing the first and second coating layers 250 and 260 will be described with reference to FIGS. 5A-5C.

The base plate 270 is arranged on an upper surface of the deposition source 230. That is, the base plate 270 is arranged further from the substrate S than the deposition source 230 and supports the deposition source 230.

In addition, a voltage may be applied between the support 220 and the deposition source 230 in order to change a state of the deposition materials, which are provided in a direction parallel to the substrate S, from a gaseous state to a plasma state. As a detailed example, a voltage may be applied to each of the support 220 and the deposition source 230, and a voltage may be applied to the base plate 270. Also, when the voltage is applied in this manner, a ground voltage may be applied to any one of the support 220, the deposition source 230, and the base plate 270.

The deposition apparatus 200 includes the power unit 280 which supplies a voltage in order to change the state of the deposition materials. The power unit 280 may provide voltages in various forms, e.g., a radio frequency (RF) voltage. However, embodiments are not limited thereto, e.g., a separate electrode (not shown) may be arranged in the deposition apparatus 200 in order to generate plasma between the support 220 and the deposition source 230.

The cleansing unit 290 is connected to the chamber 210. The cleansing unit 290 cleanses the chamber 210 if the chamber 210 is contaminated while the deposition process is performed. The cleansing unit 290 generates remote plasma to cleanse the chamber 210 and may provide the generated remote plasma to the chamber 210. For example, the cleansing unit 290 receives nitrogen trifluoride ($NF_3$) gas and changes the $NF_3$ gas to a plasma state. Then, the cleansing unit 290 injects the $NF_3$ plasma into the chamber 210 so that the injected $NF_3$ plasma contacts layers formed on an inner wall of the chamber 210 and cleanse the inner wall.

Hereinafter, the method of forming a thin film on the substrate S by using the deposition apparatus 200, and particularly, the method of depositing the first coating layer 250 and the second coating layer 260 on the mask 240 will be described with reference to FIGS. 5A to 5C.

Figure 5A:
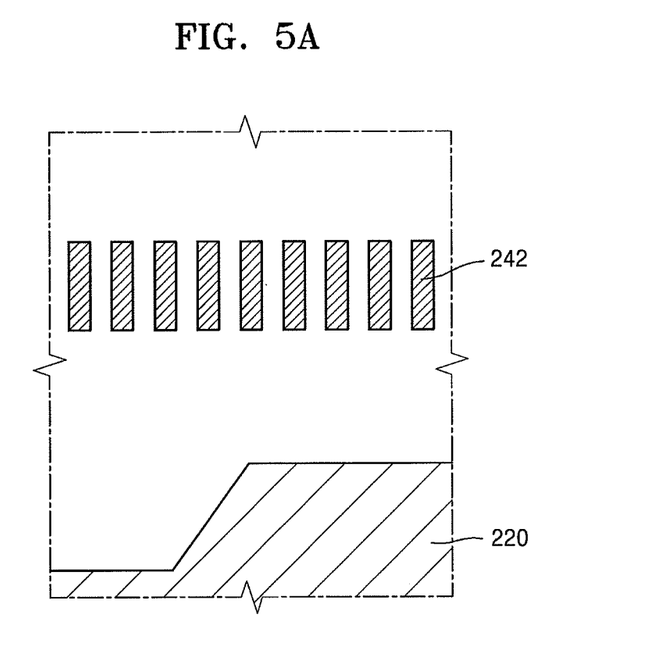
FIG. 5A illustrates a cross-sectional view of a chamber into which a mask is inserted.
Figure 5B:
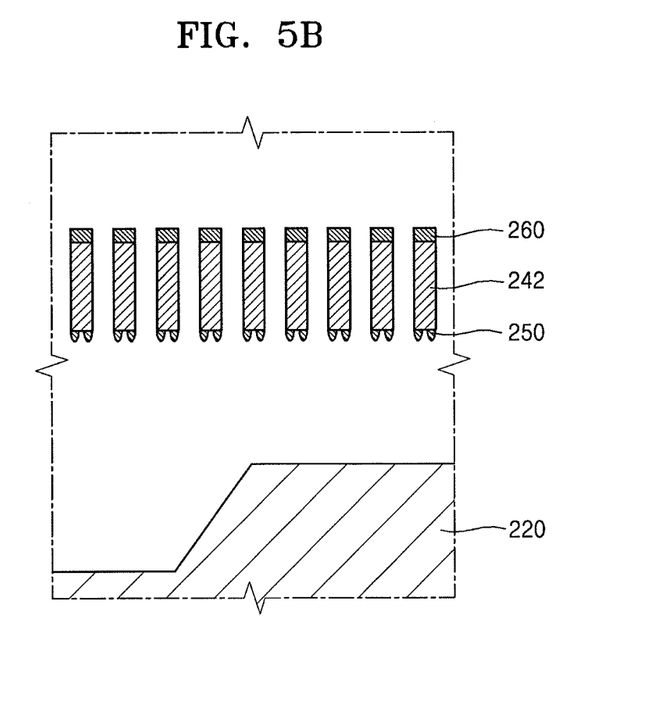
FIG. 5B illustrates a cross-sectional view of an edge region of a mask on which first and second coating layers are deposited.
Figure 5C:
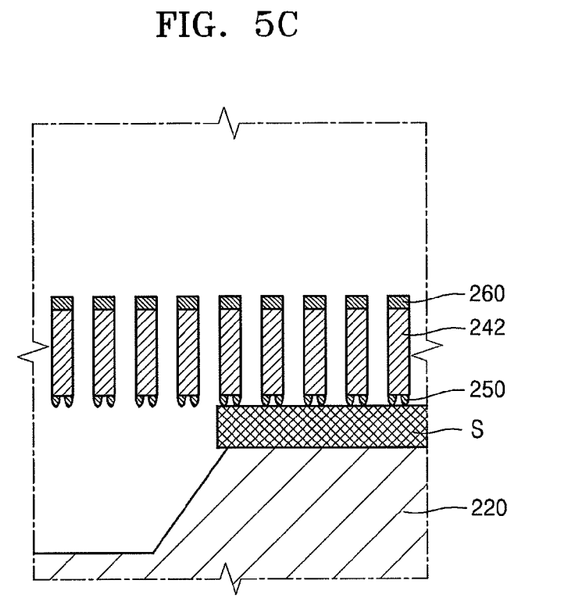
FIG. 5C illustrates a cross-sectional view of an edge region of a mask on which first and second coating layers are deposited and contact a substrate.

FIG. 5A illustrates a portion of the chamber 210 into which the mask 240 is inserted, FIG. 5B is a cross-sectional view of an edge region of the mask 240 on which the first and second coating layers 250 and 260 are deposited, and FIG. 5C is a cross-sectional view of the edge region of the mask 240 on which the first and second coating layers 250 and 260 are deposited contacts the substrate S.

Referring to FIGS. 4 and 6, before the mask 240 is inserted into the chamber 210 through the openings 210a of the chamber 210, the inner area of the chamber 210 is cleansed by using the cleansing unit 290 (operation S410). A method of cleansing the chamber 210 by using the cleansing unit 290 has already been described above.

After the inner area of the chamber 210 is cleansed by using the cleansing unit 290, the mask 240 is inserted into the chamber 210 in operation 5420. FIG. 5A show that the mask 240 is inserted into the chamber 210.

Then, as the deposition source 230 starts operating, and the deposition materials are emitted from the deposition source 230 toward the mask 240, the first coating layer 250 is deposited on the lower surface of the edge region 242 of the mask 240. At the same time, the second coating layer 260 is deposited on the upper surface of the edge region 242 in operation 5430. FIG. 5B shows that the first and second coating layers 250 and 260 are deposited on the mask 240.

Operation 5430, in which the first and second coating layers 250 and 260 are deposited on the mask 240, as shown in FIG. 6B is performed as follows. The deposition materials emitted from the deposition source 230 reach and are deposited on the upper surface of the mask 240, and then the second coating layer 260 is formed. The deposition materials that do not reach the upper surface of the mask 240 pass through the first slits 242a and reach the lower surface of the mask 240. The deposition materials that reach the lower surface of the mask 240 start to be deposited on a portion of the lower surface of the mask 240 which is close to the first slits 242a.

Accordingly, before the second slits 250a formed in the first coating layer 250 and the third slit 260a formed in the second coating layer 260 cover all of the first slits 242a formed on the mask 240, the deposition process is performed until the first coating layer 250 has a thickness enough to prevent friction with a metallic layer formed on the substrate S, but embodiments are not limited thereto. As shown in FIG. 3, the first and second coating layers 150 and 160 may cover both the upper and lower surfaces of the mask 140 by extending a time required to perform the deposition process.

A process of exposing the mask 240 to the deposition materials emitted from the deposition source 230 when the substrate S has not been yet inserted into the chamber 210 is referred to as a pre-deposition process or seasoning.

During the pre-deposition process, a deposition atmosphere is established in the chamber 210 before the deposition process is performed, and residues of the NF$_3$ plasma, i.e., fluorine, which is used as a cleansing gas during a cleansing process, is removed. In one or more embodiments, the first coating layers 150 and 250 and the second coating layers 160 and 260 are formed on the edge regions 142 and 242 of the mask 140 and 240 through the pre-deposition process.

After the first coating layer 250 and the second coating layer 260 are formed on the upper and lower surfaces of the edge region 242 of the mask 240, the operation of the deposition source 230 is temporarily stopped, and the mask 240 is arranged by inserting the substrate S into the chamber 210 so that the first coating layer 250 adheres to the substrate S in operation S440.

After the mask 240 is arranged on the substrate S in order to make the first coating layer 250 adhere the substrate S (FIG. 5C), the operation of the deposition source 230 is restarted and the deposition materials are emitted toward and through the openings in the deposition region of the mask 240. The deposition materials emitted from the deposition source 230 are deposited on the substrate S via the openings 141a of FIG. 2 formed in the mask 240 (operation S450).

Figure 7:
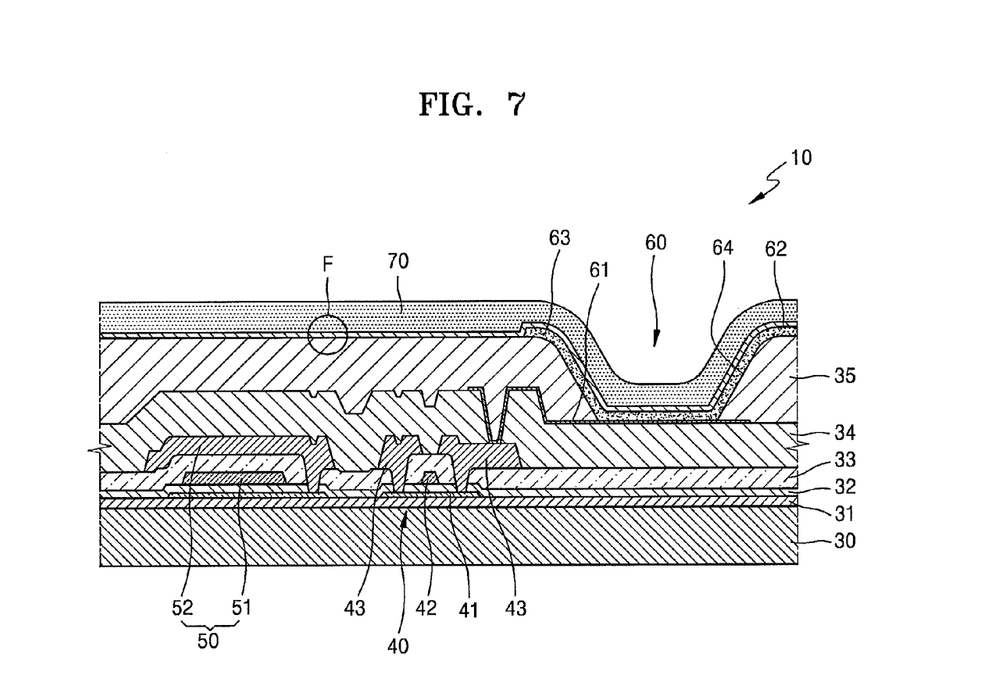
FIG. 7 illustrates a schematic cross-sectional view of an organic light-emitting display apparatus manufactured by using a deposition apparatus according to an embodiment.
Figure 8:
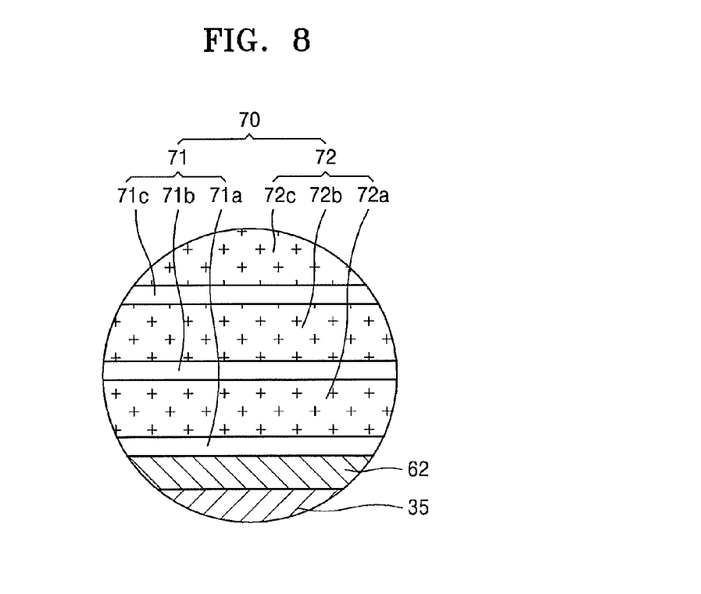
FIG. 8 illustrates an enlarged diagram of an area F of FIG. 7.

FIG. 7 is a schematic cross-sectional view of an organic light-emitting display apparatus 10 manufactured by using a deposition apparatus, according to an embodiment. FIG. 8 is an enlarged diagram of an area F of FIG. 7.

A buffer layer 31, which operates as a planarization layer on an upper surface of a substrate 30 and prevents penetration of moisture and impurities in a direction parallel to the substrate 30, is formed on the substrate 30. A thin film transistor (TFT) 40, a capacitor 50, and an organic light emitting device 60 are formed on the buffer layer 31.

The TFT 40 includes an active layer 41, a gate electrode 42, and source/drain electrodes 43. The organic light emitting device 60 includes a first electrode 61, a second electrode 62, and an intermediate layer 63. The capacitor 50 includes a first capacitor electrode 51 and a second capacitor electrode 52.

In particular, the active layer 41 having a predetermined pattern is arranged on an upper layer of the buffer layer 31. The active layer 41 may contain an inorganic semiconductor material, e.g., silicon, an organic semiconductor material, or an oxide semiconductor material, and may be formed by selectively injecting P-type or N-type dopants into these materials.

A gate insulating layer 32 is formed on an upper surface of the active layer 41. The gate electrode 42 is formed to face the active layer 41 on an upper surface of the gate insulating layer 32. The first capacitor electrode 51 may be formed on the upper surface of the gate insulating layer 32 of the same material as the gate electrode 42.

An interlayer insulating layer 33 covers the gate electrode 42, and the source/drain electrodes 43 are formed on the interlayer insulating layer 33 and contact a predetermined portion of the active layer 41. The second capacitor electrode 52 may be formed on the insulating layer 33 of the same material as the source/drain electrodes 43.

A passivation layer 34 covers the source/drain electrodes 43, and a separate insulating layer may be further formed on an upper surface of the passivation layer 34 to planarize the TFT 40. The first electrode 61 is formed on the passivation layer 34, and the first electrode 61 may be electrically connected to any one of the source/drain electrodes 43.

A pixel-defining layer 35 covers the first electrode 61. After a predetermined number of openings 64 are formed in the pixel-defining layer 35, the intermediate layer 63, which includes an emission layer, is formed in regions limited by openings 64. The second electrode 62 is formed on the intermediate layer 63.

Referring to FIG. 8, an encapsulation layer 70 is formed on the second electrode 62. The encapsulation layer 70 may contain organic or inorganic materials and may have a stack structure in which organic materials and inorganic materials are alternately stacked. As a specific example, the encapsulation layer 70 may be formed by using the deposition apparatuses 100 and 200. That is, after the substrate 30, on which the second electrode 62 is formed, is inserted into the chamber 110 and 210, a desired shape of the encapsulation layer 70 may be obtained by using the deposition apparatuses 100 and 200.

In particular, the encapsulation layer 70 includes an inorganic layer 71 and an organic layer 72, and the inorganic layer 71 includes a plurality of layers 71a, 71b and 71c. The organic layer 72 includes a plurality of layers 72a, 72b and 72c. In this case, the plurality of layers 71a, 71b and 71c of the inorganic layer 71 may be formed by using the deposition apparatuses 100 and 200.

However, embodiments are not limited thereto. That is, other insulating layers such as the buffer layer 31, the gate insulating layer 32, the interlayer insulating layer 33, the passivation layer 34, and the pixel-defining layer 35 may be formed by using the deposition apparatuses 100 and 200. Also, other thin films such as the active layer 41, the gate electrode 42, the source/drain electrodes 43, the first electrode 61, the intermediate layer 63, and the second electrode 62 may also be formed by using the deposition apparatuses 100 and 200.

As described above, if the deposition apparatuses 100 and 200 are used, characteristics of deposition layers formed on the organic light-emitting display apparatus 10 are improved, and as a result, an electrical characteristic and definition of the organic light-emitting display apparatus 10 may be improved.

Also, thin films formed on a liquid crystal display apparatus or other display apparatuses other than the organic light-emitting display apparatus 10 may be formed by using the deposition apparatuses 100 and 200. However, embodiments are not limited thereto, and thin films to be variously used may be formed by using the deposition apparatuses 100 and 200.

By way of summation and review, it is difficult to deposit large thin films as intended in order to manufacture a large-sized organic light-emitting display apparatus having improved definition. Also, there is a limit in improving the efficiency of a process for forming the thin films.

Therefore, as described above, according to the one or more of the above embodiments, a deposition apparatus, a method of forming a thin film by using the same, and a method of manufacturing an organic light-emitting display apparatus may minimize a defect regarding static electricity, which results from a contact of a mask to a substrate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a thin film, the method comprising:
   inserting a mask into a chamber, such that a first surface of the mask faces a support, and a second surface of the mask, opposite the first surface, faces a deposition source;
   depositing a first coating layer on the first surface of the mask by emitting one or more deposition materials from the deposition source toward the mask, such that the one or more deposition materials are deposited through a plurality of first slits in the mask onto the first surface of the mask;
   depositing a second coating layer on the second surface of the mask, such that the first and second coating layers are deposited simultaneously on the first and second surfaces of the mask, respectively;
   after deposition the first and second coating layers arranging a substrate between the support and the first surface of the mask, such that the first coating layer on the first surface of the mask contacts the substrate; and
   forming a thin film on the substrate by emitting the one or more deposition materials from the deposition source towards the substrate through a plurality of openings in the mask, such that the one or more deposition materials deposited on the substrate through the opening in the mask define the thin film.

2. The method as claimed in claim 1, wherein the first coating layer includes a plurality of second slits overlapping at least some of the plurality of first slits.

3. The method as claimed in claim 1, wherein the first coating layer includes a plurality of second slits overlapping at least some of the plurality of the first slits, and the second coating layer includes a plurality of third slits overlapping at least some of the plurality of the first slits.

4. The method as claimed in claim 1, wherein during deposition of the first coating layer and the second coating layer, the substrate is maintained outside the chamber.

5. The method as claimed in claim 1, further comprising cleansing the chamber by inserting remote plasma into the chamber, the remote plasma being generated by a cleansing unit connected to the chamber, and the cleansing of the chamber being performed before inserting the mask into the chamber.

6. The method as claimed in claim 1, further comprising cleansing the chamber by inserting remote plasma into the chamber, the remote plasma being generated by a cleansing unit connected to the chamber, and the cleansing of the chamber being performed after forming of the film.

7. The method as claimed in claim 1, wherein the mask is formed of a metal.

8. The method as claimed in claim 1, wherein the plurality of first slits are formed by at least one of laser beam machining, wet etching, and dry etching.

9. The method as claimed in claim 1, wherein the first coating layer and the second coating layer include at least one of silicon oxynitride (SiON) and silicon nitride ($SiN_x$).

10. The method as claimed in claim 1, wherein the thin film is formed on the substrate only after arranging the substrate in the chamber.

11. The method as claimed in claim 1, wherein depositing the first coating layer on the first surface of the mask includes depositing the one or more deposition materials through the plurality of first slits, the plurality of first slits being peripheral to the openings in the mask, and each of the first slits having a substantially smaller width than each of the openings.

12. The method as claimed in claim 1, wherein:
   after depositing the first coating layer is complete, depositing the one or more deposition materials from the deposition source is stopped to arrange the substrate, and
   after arranging the substrate, depositing the one or more deposition materials from the deposition source is started to form the thin film on the substrate through the openings in the mask.

13. A method of manufacturing an organic light-emitting display apparatus, the method comprising:
   inserting a substrate for forming the organic light-emitting display apparatus into a chamber;
   arranging the substrate between a support and a mask, wherein the mask includes:
      a deposition region including one or more openings,
      an edge region surrounding the deposition region and including a plurality of first slits,
      a first coating layer on a surface of the edge region, the first coating being in contact with the substrate, and
      a second coating layer on an opposite surface of the mask relative to the first coating, the opposite surface of the mask facing a deposition source; and
   manufacturing the organic light-emitting display apparatus by emitting one or more deposition materials for forming a thin film from the deposition source toward the substrate, such that the one or more deposition materials are deposited on the substrate through the one or more openings of the mask to form the thin film on the substrate,
   wherein, before inserting the substrate into the chamber, the first coating layer is formed on the edge region of the mask by emitting the one or more deposition materials from the deposition source toward the mask, and a second coating layer is formed on the mask opposite the first coating layer, such that the first and second coating layers are deposited simultaneously on opposite surfaces of the mask, ad such that the one or more deposition materials are deposited through the plurality of first slits in the mask onto the surface of the edge region facing the support.

14. The method as claimed in claim 13, further comprising forming a first electrode, an intermediate layer including an emission layer, a second electrode, and an encapsulation layer on the substrate,
   wherein forming the thin film includes forming the encapsulation layer.

15. The method as claimed in claim 13, wherein forming the thin film includes forming a conductive layer.

* * * * *